(12) United States Patent
Tsao et al.

(10) Patent No.: US 7,157,734 B2
(45) Date of Patent: Jan. 2, 2007

(54) SEMICONDUCTOR BOND PAD STRUCTURES AND METHODS OF MANUFACTURING THEREOF

(75) Inventors: Pei-Haw Tsao, Taichung (TW); Chender Huang, Hsin-Chu (TW); Shang-Yu Hou, Jubei (TW); Chao-Yuan Su, Koahsiung (TW); Chia-Hsiung Hsu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 10/908,839

(22) Filed: May 27, 2005

(65) Prior Publication Data

US 2006/0267008 A1    Nov. 30, 2006

(51) Int. Cl.
*H01L 23/58* (2006.01)

(52) U.S. Cl. .................. 257/48; 257/758; 257/773; 257/786

(58) Field of Classification Search ...................... None
See application file for complete search history.

(56) References Cited

U.S. PATENT DOCUMENTS

| | | | | |
|---|---|---|---|---|
| 5,441,917 A | * | 8/1995 | Rostoker et al. ............ 438/612 |
| 5,648,298 A | * | 7/1997 | Cho .......................... 438/645 |
| 5,739,587 A | * | 4/1998 | Sato .......................... 257/758 |
| 5,923,088 A | * | 7/1999 | Shiue et al. ................. 257/758 |
| 6,451,681 B1 | * | 9/2002 | Greer ......................... 438/601 |
| 6,560,862 B1 | * | 5/2003 | Chen et al. .................. 29/843 |
| 6,765,228 B1 | * | 7/2004 | Lin et al. ..................... 257/48 |
| 6,844,631 B1 | * | 1/2005 | Yong et al. ................. 257/786 |
| 7,057,296 B1 | * | 6/2006 | Hung et al. ................ 257/786 |
| 2004/0070042 A1 | * | 4/2004 | Lee et al. .................... 257/459 |
| 2005/0173801 A1 | * | 8/2005 | Mimura et al. ............. 257/758 |
| 2006/0131759 A1 | * | 6/2006 | Hung et al. ................ 257/786 |

* cited by examiner

*Primary Examiner*—Alonzo Chambliss
(74) *Attorney, Agent, or Firm*—Baker & McKenzie LLP

(57) ABSTRACT

Described is a semiconductor device having improved semiconductor bond pad reliability and methods of manufacturing thereof. The semiconductor device includes a layer formed over an integrated circuit on a semiconductor substrate. The first layer includes a conductive portion and an insulating portion. A second layer is then formed over the first layer and includes a conductive portion corresponding to the first layer's conductive portion and an insulating portion corresponding to the first layer's insulating portion. A bond pad is then formed over the first and second layers such that the bond pad is substantially situated above the conductive portions and the insulating portions of the first and second layers. A bonding ball is then formed on the bond pad substantially above the conduction portion of the first and second layers.

20 Claims, 5 Drawing Sheets

SEMICONDUCTOR BOND PAD STRUCTURES AND METHODS OF MANUFACTURING THEREOF

BACKGROUND

Semiconductor devices are manufactured in a variety of different ways and often require die-size chip assembly. One manufacturing process often associated with die-size chip assembly is a wire bonding assembly process in which semiconductor bond pads are electrically connected to landing pads formed on an external substrate. It has been found that peeling failures of semiconductor bonding pads during the wire bonding assembly process can undermine mechanical reliability in wire-bonded devices. In other words, semiconductor bond pads and associated portions of the semiconductor device can shear or rip off as the wire bond is being attached, thus leading to poor mechanical reliability of the resulting semiconductor device.

FIG. 1 illustrates a typical wire-bonded semiconductor package 100 having a semiconductor chip 102 disposed over an external package substrate 104. A plurality of bond pads 106 are formed on the semiconductor chip 102, and are electrically connected to a plurality of landing pads 108 via a plurality of wire bonds 110. A conventional wire bonding assembly process involves initially forming a bonding ball (not shown) over the bond pad 106, by metallic bond wires 110, formed of materials such as gold or copper.

During fabrication of wire-bonded semiconductor devices, underlying semiconductor layers undergo thermal and mechanical stress as a result of the processing steps (e.g. annealing) carried out on such devices. Accordingly, with each successive processing step, the material strength of the underlying layers is weakened, thus becoming less resistant to structural impact forces that can occur during latter processing steps such as the wire bonding attachment process or testing and probing. Consequently, the bond pads 106 can shear or rip off of the semiconductor chip 102 as a result of the stress exerted thereon. In some cases, portions of the semiconductor chip 102 associated with each bond pad 106 can shear or rip off, such as portions of the semiconductor chip underlying the bond pad (e.g. a dielectric layer) or portions of the semiconductor chip overlying the bond pad (e.g. a bonding ball). Thus, there exists a need to enhance the material strength of the bond pads 106 and thereby improve the structural reliability of semiconductor-packaged devices.

SUMMARY

Described are semiconductor devices having improved bond pad structures and methods of manufacturing semiconductor devices having improved bond pad structures. In one embodiment, an improved semiconductor device includes an integrated circuit initially formed on a substrate. A first layer with a grid array of metal contact holes (e.g. metal contact region) is subsequently formed over the integrated circuit. A second layer with an insulating cavity is then subsequently formed over the first layer. The insulating cavity region of the second layer is formed to generally correspond to the insulating portion of the first layer, and therefore is not in contact with the metal contact region of the first layer. A bond pad is then formed over the first and second layers such that the bond pad is substantially, or at least somewhat coextensive with each of the metal contact region of the first layer and the insulating cavity region of the second layer. A bonding ball may then be formed on a region of the bond pad overlying the metal contact region of the first layer.

DETAILED DESCRIPTION OF THE PREFERRED EMBODIMENTS

Figure 1:
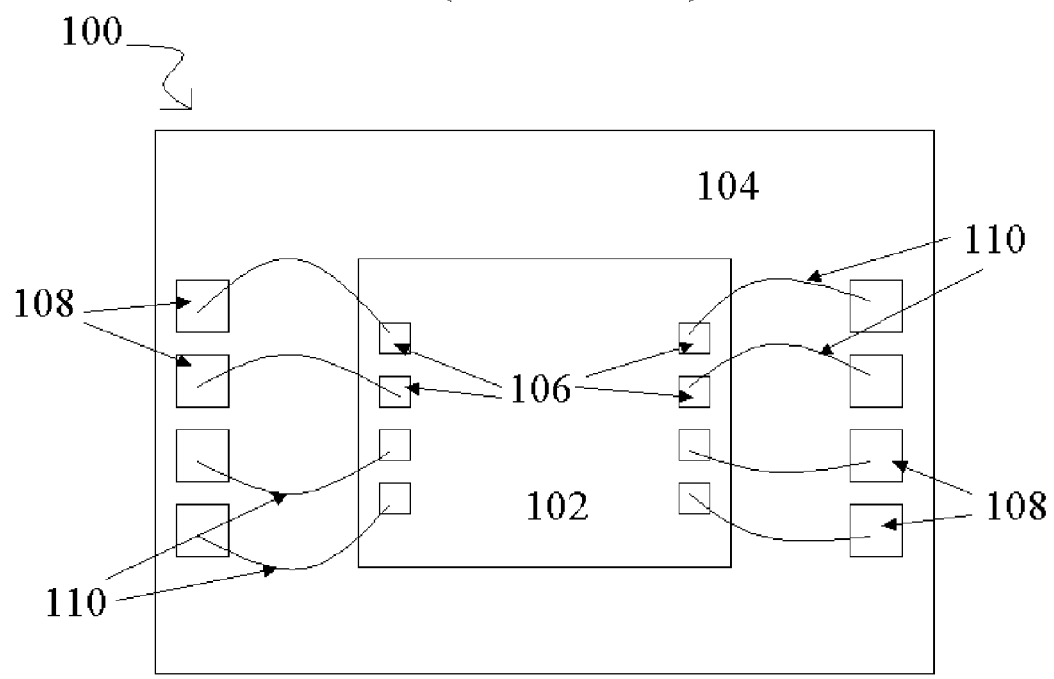
FIG. 1 is a plan view of prior-art packaged semiconductor device.
Figure 2A:
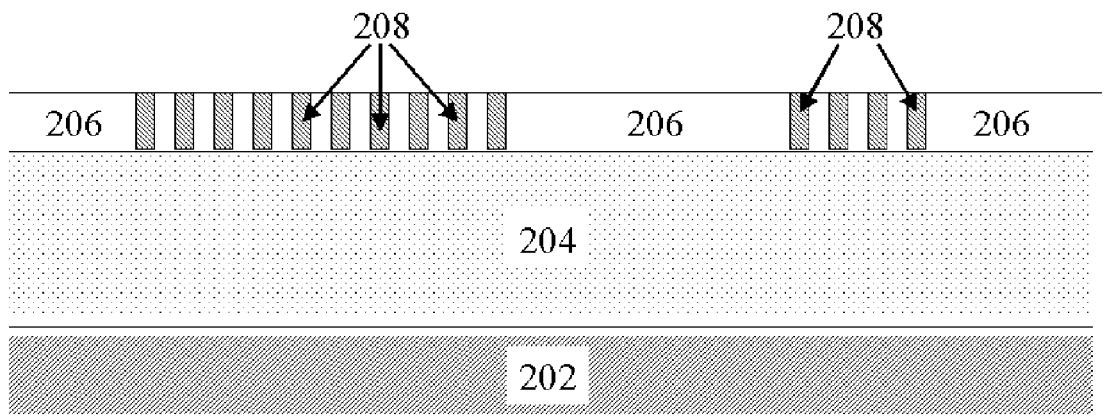
FIGS. 2A–2D are cross-sectional views of progressive stages of forming a semiconductor bond pad structure according to the present disclosure.

FIGS. 2A–2D illustrate cross-sectional views of progressive stages of forming a semiconductor bond pad structure according to the present disclosure. In FIG. 2A, a semiconductor device generally begins with an integrated circuit 204 formed over a semiconductor substrate 202. Within the integrated circuit 204 are multiple layers of interconnects (not shown), which may include interlevel metal dielectric, interlevel dielectric, gate electrodes, isolation regions, capacitors and other features or devices commonly found in semiconductor devices. After forming the integrated circuit 204 on the semiconductor substrate 202, a dielectric layer 206 is formed over the integrated circuit 204. Typical materials used in forming the dielectric layer 206 may include silicon oxide, silicon oxynitride, doped silicate glass, and undoped silicate glass. In order to transmit electrical signals out of the integrated circuit 204, openings 208 are formed through the dielectric layer 206 using known lithographic and etching techniques. The openings or contact holes 208 are then filled with a metallic material such as copper, aluminum, gold, tungsten, or mixtures thereof to form metal contact holes 208, also referred to as metal vias. The semiconductor wafer is then subsequently subjected to a chemical mechanical polish (CMP) process to planarize or level the wafer for further processing.

In some embodiments, formation of the metal contact holes 208 and formation of the dielectric layer 206 may be reversed. In other words, the formation of the metal contact holes 208 can take place prior to formation of the dielectric layer 206. In this scenario, a metallic film may be initially formed instead of the dielectric layer 206. The metallic film may then be processed using known lithographic and etching methods and techniques to form the metal contact holes 208. A blanket layer of dielectric material may then be deposited after formation of the metal contact holes 208. Any protrusions or extrusions that are not level may then be subjected to a CMP process to planarize or level the interconnects.

Figure 2B:
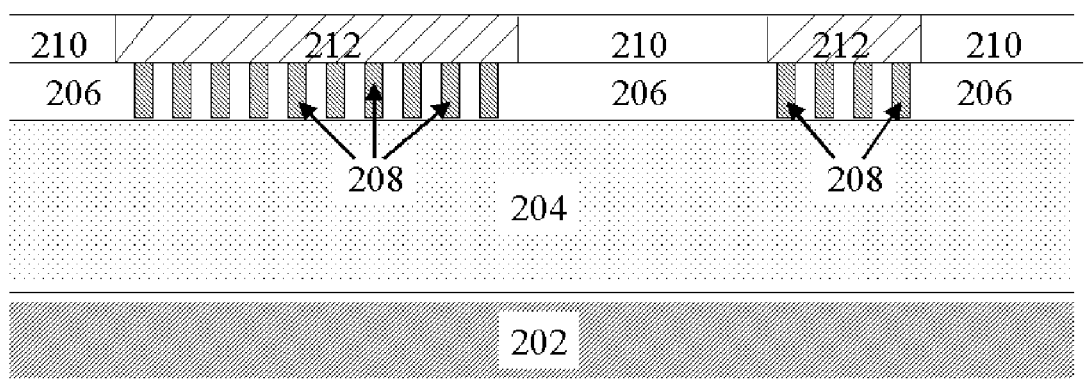

Referring to FIG. 2B, regardless of the order of forming the dielectric layer 206 and the metal contact holes 208, the resulting wafer may be blanket deposited with another dielectric layer 210 using the same or similar materials and methods as the previous dielectric layer 206. Thereafter, another set of metal contact holes 212 is formed in the dielectric layer 210 using the same or similar materials and methods as the previous set of metal contact holes 208. As explained above with respect to the dielectric layer 206 and the metal contact holes 208, the order of forming this set of metal contact holes 212 and dielectric layer 210 may also be reversed. Accordingly, layers 206, 210 may be initially formed as conductive layers rather than dielectric layers. The wafer may then be subjected to another CMP process to planarize or level the wafer for further processing.

Figure 2C:
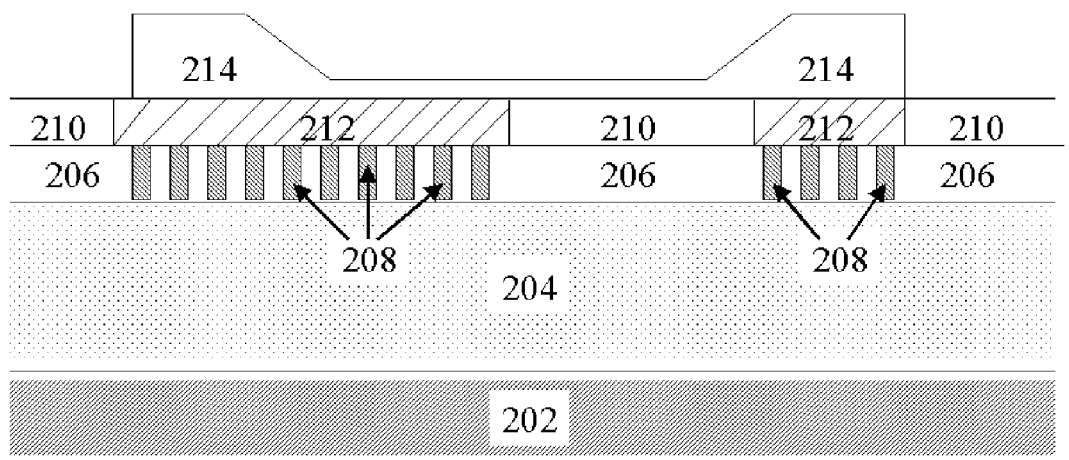

Referring to FIG. 2C, a bond pad 214 is subsequently formed on the wafer. The bond pad 214 may be formed of a variety of materials, such as aluminum, gold or copper. Additionally, the bond pad 214 may take a variety of configurations, including shapes other than that depicted in FIG. 2C. During probing and testing of the wafer, an electrical signal is transmitted from the integrated circuit 204 through the metal contact holes 208, 212 and out through the bond pad 214.

Figure 2D:
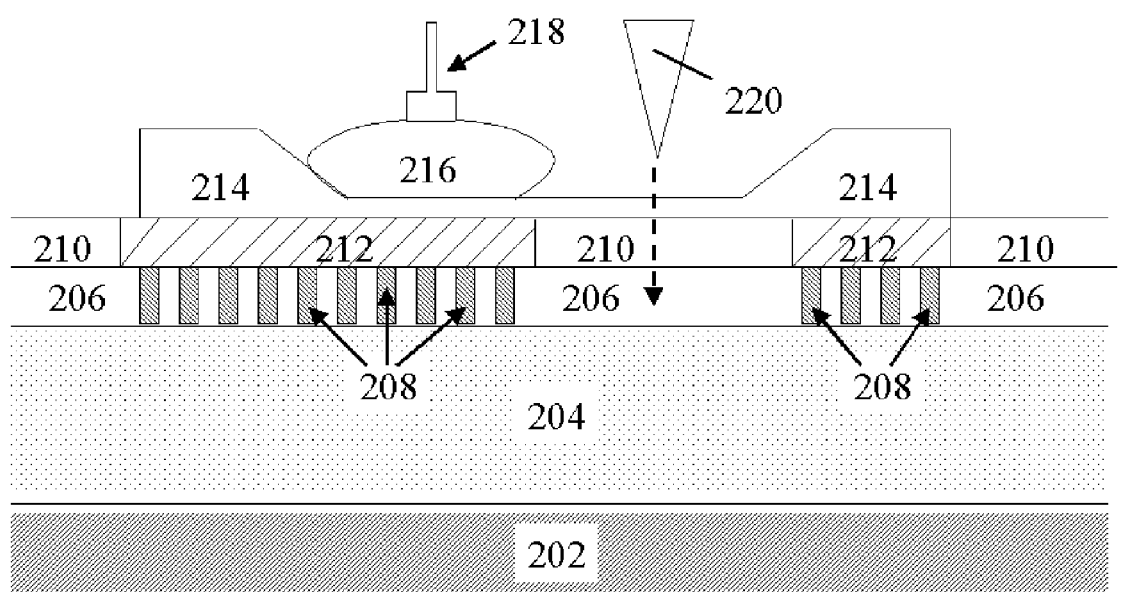

Referring to FIG. 2D, a metal bump (e.g. solder ball) 216 is then formed over a portion of the bond pad 214. The bonding ball 216 is typically formed during wire bond process (formed of other metallic materials such as gold, copper, or aluminum) during a wire bonding assembly process. The wire bond 218 is generally used to connect the integrated circuit 204 with an external package.

In some embodiments, the bonding ball 216 is formed in an off center position on the bond pad 214 to allow for probing and testing of the wafer. Positioning the bonding ball 216 on one side of the bond pad 214 provides a larger bond pad testing area defined as the portion of the bond pad 214 not occupied by the bonding ball 216. Accordingly, probing and testing can be carried out before IC package assembly process with a metal probe 220 to determine the functionality of the integrated circuit 204. Properly functioning devices will be put to use, while those that do not yield, or have failed to meet device specifications, can be scrapped or otherwise disposed of.

During probing and testing, the metal probe 220 makes physical contact with the bond pad 214 in an area adjacent to the bonding ball 216 area (to the right of the bonding ball 216 area as illustrated in FIG. 2D). In practice, the metal probe 220 may dent or otherwise mark the bond pad 214. In some cases, such denting or marking will not adversely affect the underlying integrated circuit 204. However, there may be times when the metal probe 220 damages the wafer by penetrating through the bond pad 214 and potentially exposing the integrated circuit 204 to air. In this respect, the dielectric layer 210 can protect the integrated circuit 204 from potential exposures to air should the metal probe 220 penetrate through the bond pad 214. In particular, the dielectric layer 210 can protect the underlying metallic layers from exposure to air after chip probe and test because the dielectric layer 210 is already oxidized. In a worst-case scenario, if the metal probe 220 penetrates through the bond pad 214 and the dielectric layer 210, the underlying dielectric layer 206 provides an additional layer of protection. Thus, the portion of the wafer corresponding to the probe/test area of the bond pad 214 is constructed of dielectric material between the bond pad and the integrated circuit 204. Also, the portion of the wafer corresponding to the positioning of the bonding ball 216 includes an electrical path defined from the integrated circuit 204, through the metallic contact holes 208, 212 and to the bonding ball 216. Therefore, according to the teachings of the present disclosure, only dielectric materials may be exposed to air, while underlying metallic layers within the integrated circuit 204 and the metallic material associated with the metal contact holes 208, 212 are prevented from undergoing oxidation or corrosion resulting from exposure to air.

In addition to preventing oxidation and corrosion, the integrated circuit 204 also has added strength to withstand the wire bonding assembly process. In practice, the wire bonding assembly process yields a large impact force, which can negatively affect the integrated circuit 204. For example, in some instances, the wire bonding process may cause detachment of a corresponding portion of the bond pad 214 from the integrated circuit 204. In severe cases, additional underlying layers, such as the dielectric layers 206, 210 may also be sheared off. As described above, layers 206, 210 includes metallic materials underlying the bonding ball 216. Metallic material is generally physically stronger than dielectric material, and therefore, has a higher impact force resistance. Accordingly, providing metallic material underneath the bonding ball 216 increases the material strength of the corresponding portion of the integrated circuit 204, thereby preventing, or at least decreasing, the existence of wire bond peeling failures. In other words, the bonding ball 216, and the aluminum bond pad 214 are less likely to be ripped off or sheared off due to the combined material strength of the metal contact holes 208, 212. Additionally, the number and proximity of the metal contact holes 208, 212 also affect strength. For example, increasing the number and proximity of metal contact holes 208, 212 formed in the integrated circuit 204 will increase the strength (and the impact resistance) of the corresponding portion of the bond pad 214.

It will be appreciated by those of ordinary skill in the art that the invention can be embodied in other specific forms without departing from the spirit or essential character thereof. For example, although the metal contact holes 208 appear to be rectangular in shape, they may take on a plurality of shapes such as square, circle, or cylindrical shapes. Additionally, the sizes of the metal contact holes 208 may also vary in width, length and thickness. Furthermore, they may be further reinforced in a grid array arrangement. In addition, although two dielectric layers 206, 210 were coupled to two sets of metal contact holes 208, 212, they may be combined into one dielectric layer and one set of metal contact holes, or be further dissociated into three, four, or even five sets of dielectric layers and metal contact holes. The presently disclosed embodiments are therefore considered in all respects to be illustrative and not restrictive. The scope of the invention is indicated by the appended claims rather than the foregoing description, and all changes that come within the meaning and ranges of equivalents thereof are intended to be embraced therein.

Additionally, the section headings herein are provided for consistency with the suggestions under 37 C.F.R. § 1.77 or otherwise to provide organizational cues. These headings shall not limit or characterize the invention(s) set out in any claims that may issue from this disclosure. Specifically and by way of example, although the headings refer to a "Technical Field," the claims should not be limited by the language chosen under this heading to describe the so-called technical field. Further, a description of a technology in the "Background" is not to be construed as an admission that technology is prior art to any invention(s) in this disclosure. Neither is the "Summary of the Invention" to be considered as a characterization of the invention(s) set forth in the claims found herein. Furthermore, any reference in this disclosure to "invention" in the singular should not be used to argue that there is only a single point of novelty claimed in this disclosure. Multiple inventions may be set forth according to the limitations of the multiple claims associated with this disclosure, and the claims accordingly define the invention(s), and their equivalents, that are protected thereby. In all instances, the scope of the claims shall be considered on their own merits in light of the specification, but should not be constrained by the headings set forth herein.

What is claimed is:

1. A semiconductor device, comprising:
an integrated circuit formed on a substrate;

a first layer formed over the integrated circuit, the first layer having a conductive portion and an insulating portion;

a second layer formed over the first layer, the second layer having a conductive portion corresponding to the conductive portion of the first layer and an insulating portion corresponding to the insulating portion of the first layer;

a bond pad formed over the second layer; and a metal bonding ball disposed on the bond pad, the metal bonding ball being formed substantially off-center on the bond pad and substantially over the first and second conductive portions to define a testing area of the bond pad capable of being test-probed and corresponding to the insulating portions of the first and second layers.

2. A semiconductor device according to claim 1, wherein the first layer is formed substantially of a dielectric material and wherein the conductive portion of the first layer comprises one or more apertures formed through the first layer, the one or more apertures being filled with a conductive material.

3. A semiconductor device according to claim 2, wherein the one or more apertures are arranged in a grid.

4. A semiconductor device according to claim 2, wherein the dielectric material is selected from the group consisting of silicon oxide, silicon nitride, silicon oxynitride, undoped silicate glass, and doped silicate glass.

5. A semiconductor device according to claim 2, wherein the conductive material is selected from the group consisting of copper, aluminum, gold, and mixtures thereof.

6. A semiconductor device according to claim 1, wherein the second layer is formed of a dielectric material and the conductive portion of the second layer comprises one or more apertures formed through the second layer, the one or more apertures being filled with a conductive material.

7. A semiconductor device according to claim 6, wherein the one or more apertures are arranged in a grid.

8. A semiconductor device according to claim 6, wherein the dielectric material is selected from the group consisting of silicon oxide, silicon nitride, silicon oxynitride, undoped silicate glass, and doped silicate glass.

9. A semiconductor device according to claim 6, wherein the conductive material is selected from the group consisting of copper, aluminum, gold, and mixtures thereof.

10. A semiconductor device according to claim 1, wherein the testing area of the bond pad comprises a width greater than a width of a probing device tip.

11. A semiconductor device according to claim 10, wherein the insulating portions of the first and second layers each comprise a width greater than a width of the probing device tip.

12. A semiconductor device, comprising:
an integrated circuit formed on a substrate;
a first dielectric layer formed over the integrated circuit, the first dielectric layer having one or more apertures formed therethrough, the one or more apertures being substantially filled with a conductive material;
a second dielectric layer formed over the first dielectric layer, the second dielectric layer having one or more apertures formed therethrough, the one or more second layer apertures being substantially filled with a conductive material;
a bond pad formed over the second layer; and
a bonding ball disposed on the bond pad, the bonding ball being formed substantially off-center on the bond pad and substantially over the first and second conductive portions to define a testing area of the bond pad capable of being test-probed and formed over corresponding insulating portions of the first and second dielectric layers, whereby the integrated circuit is in electrical communication with the bonding ball via the first layer apertures, the second layer apertures and the bond pad.

13. A semiconductor device according to claim 12, wherein the first and second dielectric layers are formed of dielectric material selected from the group consisting of silicon oxide, silicon nitride, silicon oxynitride, undoped silicate glass, and doped silicate glass.

14. A semiconductor device according to claim 12, wherein the conductive material of the first layer apertures and the second layer apertures is selected from the group consisting of copper, aluminum, gold, and mixtures thereof.

15. A method for forming a semiconductor device, comprising:
providing a semiconductor substrate;
forming an integrated circuit on the substrate;
forming a first layer over the integrated circuit, the first layer having a conductive portion and an insulating portion;
forming a second layer over the first layer, the second layer having a conductive portion and an insulating portion, the second layer conductive portion corresponding to the first layer conductive portion, and the second layer insulating portion corresponding to the first layer insulating portion;
forming a bond pad over the second layer; and
forming a bonding ball on the bond pad, the bonding ball being substantially off-center on the bond pad and substantially over the first and second layer conductive portions to define a testing area of the bond pad capable of being test-probed and corresponding to the insulating portions of the first and second layers.

16. A method according to claim 15, wherein forming a first layer comprises forming a dielectric layer, forming one or more apertures through the dielectric layer, and substantially filling the one or more apertures with a conductive material.

17. A method according to claim 15, wherein forming a second layer comprises forming a conductive layer, forming one or more cavities through the conductive layer, and substantially filling the one or more cavities with a dielectric material.

18. A method according to claim 17, wherein the cavities formed in the conductive layer are laterally displaced from the one or more apertures formed through the dielectric layer.

19. A method according to claim 15, wherein forming a second layer comprises forming a dielectric layer, forming one or more apertures through the dielectric layer, and substantially filling the one or more apertures with a conductive material.

20. A method according to claim 19, wherein the one or more apertures of the second dielectric layer correspond to the one or more apertures of the first dielectric layer.

* * * * *